(12) United States Patent
Ackerman et al.

(10) Patent No.: US 6,486,999 B1
(45) Date of Patent: Nov. 26, 2002

(54) USING CRYSTALLINE MATERIALS TO CONTROL THE THERMO-OPTIC BEHAVIOR OF AN OPTICAL PATH

(75) Inventors: David Alan Ackerman, Hopewell, NJ (US); Richard Bendicks Bylsma, Allentown, PA (US); Robert Louis Hartman, Warren Township, NJ (US); Glen Robert Kowach, Fanwood, NJ (US); Malcolm Ellis Lines, Millington, NJ (US); Lynn Frances Schneemeyer, Westfield, NJ (US); Thomas Lawson Koch, Holmdel, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/525,512

(22) Filed: Mar. 15, 2000

(51) Int. Cl.[7] .............................. G02F 1/01; G02F 1/03
(52) U.S. Cl. ...................... 359/288; 359/260; 359/244; 359/124; 385/16; 385/2; 372/20; 372/32
(58) Field of Search ................................. 359/288, 244, 359/260, 265, 237, 238, 246, 249, 256; 385/16, 2; 349/21, 161; 372/20, 32, 29

(56) References Cited

U.S. PATENT DOCUMENTS

| 4,497,544 A | * | 2/1985 | Mitchell et al. | ............ 359/244 |
|---|---|---|---|---|
| 4,615,587 A | * | 10/1986 | Krasutsky et al. | ........... 359/288 |
| 4,886,331 A | * | 12/1989 | Peterson | ....................... 385/16 |
| 5,212,584 A | * | 5/1993 | Chung | ........................... 359/260 |
| 5,459,799 A | * | 10/1995 | Weber | ............................. 385/2 |
| 5,608,568 A | * | 3/1997 | Blotgett et al. | ............. 359/288 |
| 6,295,158 B1 | * | 9/2001 | Mueller-Fiedler et al. | .. 359/288 |
| 6,370,166 B1 | * | 4/2002 | Akaoka et al. | ............... 372/20 |
| 6,370,169 B1 | * | 4/2002 | Imajuku et al. | ................ 372/32 |
| 6,384,958 B1 | * | 5/2002 | Morozov | ..................... 359/288 |

OTHER PUBLICATIONS

T. Kimura et al., *Temperature Compensation of Birefringent Optical Filters*, Proc. IEEE, pp. 1273–1274 (Aug. 1971).

* cited by examiner

Primary Examiner—Loha Ben
(74) Attorney, Agent, or Firm—Michael J. Urbano (57) ABSTRACT

The thermo-optic behavior of an optical path over a range of temperatures $\Delta T$ is controlled by determining a figure-of-merit (FOM) for the optical path and including in the path a body of crystalline material that enables the conditions specified by the FOM to be satisfied. The crystalline material is highly transparent at a wavelength $\lambda$ of radiation propagating in the path, and it has a coefficient of thermal expansion (CTE) and a refractive index $n$ such that the CTE and $dn/dT$ are mutually adapted to satisfy the FOM over the range $\Delta T$. In one embodiment, the CTE and $dn/dT$ of an etalon compensate one another so as to perform frequency discrimination that is essentially temperature insensitive over the range $\Delta T$. In a preferred embodiment of the optical etalon the crystalline material comprises $LiCaAlF_6$.

49 Claims, 4 Drawing Sheets

USING CRYSTALLINE MATERIALS TO CONTROL THE THERMO-OPTIC BEHAVIOR OF AN OPTICAL PATH

FIELD OF THE INVENTION

This invention relates generally to optical devices and systems and, more particularly, to controlling the thermo-optic behavior of optical paths within such devices and systems.

BACKGROUND OF THE INVENTION

In general the properties of an optical device are sensitive to changes in its temperature. For example, the output wavelength, the optical power output and current threshold of a semiconductor laser are sensitive to temperature. Similarly, the propagation constants of optical modes in a semiconductor or glass waveguide also change with temperature. Typically optical devices and systems are designed to account for such thermally-induced shifts, at least in those device/system parameters that are the most important for proper performance of the device/system.

Consider, for instance, optical networking that is currently in an exponential growth mode. The design and deployment of new dense wavelength division multiplexed (DWDM) systems is having a profound effect on the availability and use of bandwidth by vastly expanding the amount of information that can be transmitted on a single optical fiber. Because such systems are so new, much of the growth occurring in the last few years, opportunities exist to contribute subsystems that improve or simplify aspects of the operation of a DWDM network. One way to provide such improvement and/or simplification is to be able to control the thermo-optic behavior of the system components over an operating range $\Delta T$.

In a DWDM system the channel wavelengths are packed together at minimal spacing. Therefore, any significant drift in the output wavelength of the lasers (used as carrier signal sources) is a serious problem. One source of wavelength drift is aging of the lasers. Wavelength changes due to aging can be corrected by changing the temperature of the laser by means of a thermoelectric cooler/heater (TEC). Although the wavelength of each lasers can be controlled by an etalon used as a frequency discriminator, the optical path length of the etalon is also temperature sensitive. Thus, changing the temperature of the laser might also change the temperature of the etalon if the two devices are located in the same package. However, other phenomena can also affect the temperature of the etalon and hence its optical path length; e.g., aging (1) of the temperature control circuit used to maintain the laser at a predetermined temperature and at a predetermined output wavelength; and (2) the temperature gradient produced across the etalon because the TEC is typically located at the base of the etalon.

Consequently, there is a need in the frequency discriminator art for an etalon that is essentially temperature insensitive over the temperature operating range of the corresponding optical system.

There is also a need in optical systems in general to be able to control the thermo-optic behavior of an optical path such as, for example, by compensating or balancing one parameter against another, or by enhancing a selected parameter. The latter finds application in temperature sensors, whereas the former finds application not only in the etalon discussed above, but also in a broad spectrum of optical apparatus ranging from telescopes to Mach-Zehnder interferometers.

SUMMARY OF THE INVENTION

In accordance with one aspect of our invention, a method of controlling the thermo-optic behavior of an optical path over a range of temperatures $\Delta T$ comprises the steps of determining a figure-of-merit (FOM) for the optical path and including in the path a body of crystalline material that enables the conditions specified by the FOM to be satisfied. The crystalline material is highly transparent at a wavelength $\lambda$ of radiation propagating in the path, and it has a coefficient of thermal expansion (CTE) and a refractive index n such that the CTE and dn/dT are mutually adapted to satisfy the FOM over the range $\Delta T$. In one embodiment, the CTE and dn/dT of an etalon compensate one another so as to perform frequency discrimination that is essentially temperature insensitive over the range $\Delta T$. In a preferred embodiment of the optical etalon the crystalline material comprises $LiCaAlF_6$.

In accordance with another aspect of our invention, an article of manufacture (e.g., apparatus, device, subassembly, subsystem, system) comprises an optical path over which radiation at a wavelength $\lambda$ propagates, and, disposed in the path, a body of crystalline material that enables the conditions specified by the FOM to be satisfied. The crystalline material is highly transparent at a wavelength $\lambda$ of radiation propagating in the path and has a coefficient of thermal expansion (CTE) and refractive index n such that the CTE and dn/dT are mutually adapted to satisfy the FOM over the range $\Delta T$. In one embodiment, the CTE and dn/dT of an etalon compensate one another so as to form a frequency discriminator that is essential temperature insensitive over the range $\Delta T$. In a preferred embodiment of the etalon the crystalline material comprises $LiCaAlF_6$.

BRIEF DESCRIPTION OF THE DRAWINGS

Our invention, together with its various features and advantages, can be readily understood from the following more detailed description taken in conjunction with the accompanying drawing, in which.

In the interest of clarity and simplicity, FIGS. 1–6 and 9 have not been drawn to scale.

DETAILED DESCRIPTION OF THE INVENTION

Figure 1:
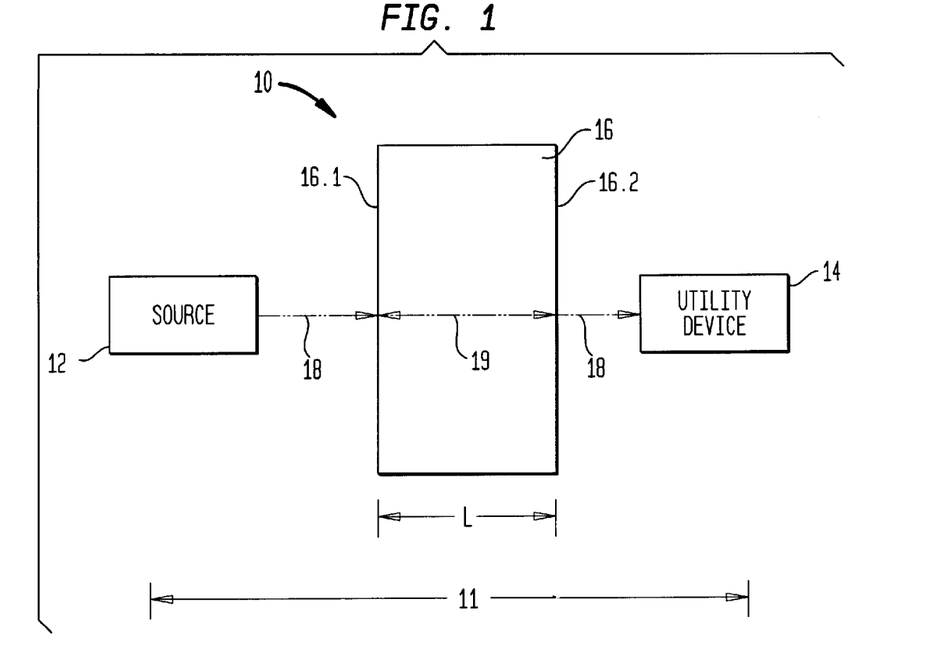
FIG. 1 is a schematic, block-diagrammatic view of an article of manufacture that includes an etalon that may be used as a frequency discriminator in accordance with an illustrative embodiment of our invention.

With reference now to FIG. 1, there is shown an article of manufacture 10 (e.g., a device, apparatus, subassembly, subsystem, system, etc.) that includes an optical path 11 defined by a source of radiation 12, a utilization device 14 and a transmission medium 18 coupling them to one another. In accordance with one aspect of our invention, a figure of merit (FOM) is defined for the optical path, and a body 16 of crystalline material is disposed in the path so that the FOM is satisfied. More specifically, the crystalline material is highly transparent at a wavelength λ of the radiation propagating in the path 11, and it has a coefficient of thermal expansion (CTE) and refractive index n such that the CTE and dn/dT are mutually adapted to satisfy the FOM over the range ΔT.

In general, the source 12 may include an active device (e.g., a semiconductor laser) or a passive device (e.g., an optical waveguide through which an optical radiation signal propagates, or an object from which optical radiation is reflected or scattered), or a combination of active and passive devices. Likewise the utilization device 14 may include a photodetector, an optical receiver, an optical waveguide, an optical isolator, an optical coupler or multiplexor, a piece of terminal equipment, or a combination of them. On the other hand, the transmission medium 19 may include, for example, an air path, an optical fiber, or an integrated optical waveguide (as in the planar waveguides of silicon optical bench or semiconductor technology, for instance).

Figure 9:
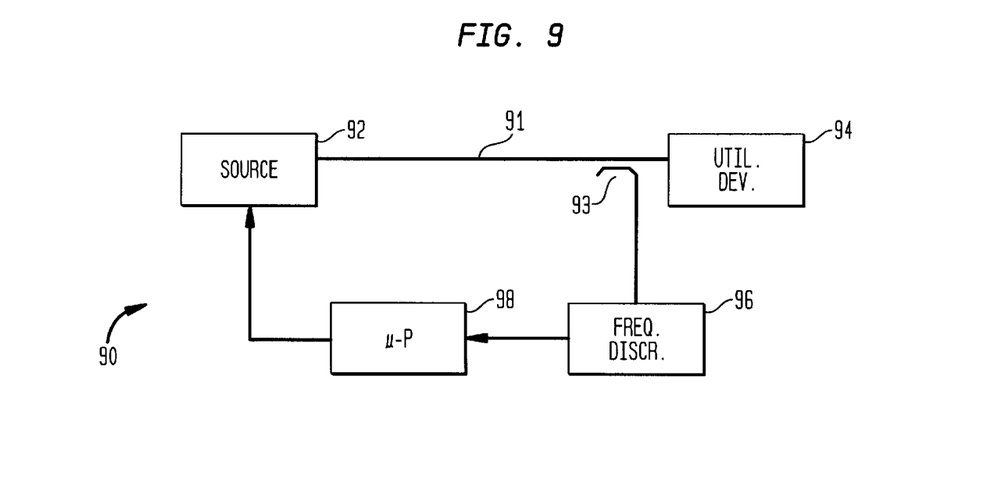
FIG. 9 is a block-diagrammatic view of an optical transmitter in accordance with one embodiment of our invention.

A typical optical transmitter 90 that incorporates some of these components is illustrated in FIG. 9. A tunable source 92 is coupled to a utilization device 94 via an optical fiber 91. A portion of the laser output is tapped by coupler 93 to provide an input to frequency discriminator 96. The latter includes an etalon as the principal filtering element, as is well known in the art. The output of the frequency discriminator is provided to microprocessor 98 that generates an error signal to control the wavelength of source 92 (e.g., via its temperature and/or its drive current). Thus, the coupler, discriminator and microprocessor form a feedback loop that controls the source wavelength. This type of transmitter is described in more detail by D. A. Ackerman in copending, allowed patent application Ser. No. 09/330,389 filed on Jun. 6, 1999, now U.S. Pat. No. 6,064,681. This application is assigned to the assignee hereof and is incorporated herein by reference.

Optical Etalon Embodiment

With reference again to FIG. 1, the article of manufacture 10 provides a frequency discrimination function; that is, the source 12 typically comprises a semiconductor laser, the utilization device 14 typically comprises a photodetector as part of an optical receiver, the transmission medium is air, and the body 16 of crystalline materials serves an etalon. As is well known in the art, an etalon includes essentially parallel input and output surfaces 16.1 and 16.2 that form a resonator of length L. Theses surfaces are typically coated so as to be partially transmissive and partially reflective to the radiation from source 12. When that radiation is coupled into the etalon through input surface 16.1, a standing wave pattern is formed as designated by the double-headed arrow 19. Consequently, the transmission properties of the etalon are characterized by the well-recognized comb-like functions shown in FIG. 2. Thus, maximum transmission of radiation through the etalon occurs only at certain wavelengths that are spaced apart by c/2nL, where c is the speed of light in a vacuum, n is the group refractive index of the crystalline material of body 16, and L, in this case, is the separation of the surfaces as measured along the direction of radiation propagation therethrough. At wavelengths in between the maxima, the amount of radiation that is transmitted through the etalon decreases dramatically.

Figure 2:
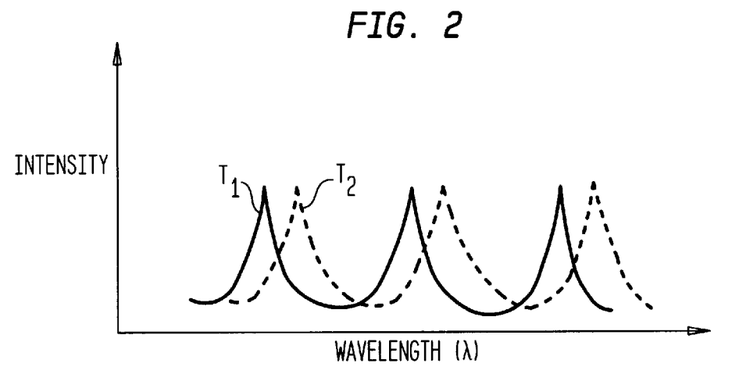
FIG. 2 is a schematic view of the comb-like frequency characteristics of an etalon as a function of temperature.

Thus, the optical etalon operates to filter out signals at wavelengths other than those that are coincident, or nearly so, with the maxima in the etalon transmission characteristic, which may be used to stabilize the wavelength of the source 12. However, an etalon may be subjected to changes in temperature that cause the transmission characteristic to shift, as shown in FIG. 2. Here, the curve labeled $T_1$ shifts to longer wavelengths (curve labeled $T_2$) when the temperature of the etalon increases from $T_1$ to $T_2$. Similarly, a decrease in temperature would cause the curves to shift to shorter wavelengths. Such changes in temperature could result from a variety of sources. For example, the ambient temperature of the system in which the etalon is located could change due to natural causes (e.g., weather), or the temperature of the laser (which is often located in the same package as the etalon) could be changed intentionally as part of a wavelength tuning protocol (e.g., in a WDWM system), resulting in a change of the etalon's temperature, or the temperature control circuit could be imperfect due to its aging slowly or changing suddenly. In any case, temperature-induced shifts in the transmission characteristics of the etalon are undesirable inasmuch as significant shifts may cause the system performance to degrade to a level outside of system specifications.

In accordance with one embodiment of our invention, the change in optical path length through the etalon due to thermal expansion is balanced, or nearly so, by the temperature-induced change in its refractive index given by dn/dT; i.e., the etalon is made to be essentially temperature insensitive. We express the balancing using the equation for optical path length $L_0$ given by:

$$L_o = nL \tag{1}$$

where we take the optical path in this case to be only the path segment defined by the etalon itself (not the entire path 11 shown in FIG. 1). Then, we take the derivative of equation (1) with respect to temperature; to wit, $$dL_o/dT = n(dL/dT) + L(dn/dT) \tag{2}$$

$$nL[(1/L)(dL/dT) + (1/n)(dn/dT)] \tag{3}$$

but, by definition, $$CTE = (1/L)(dL/dT) \tag{4}$$

therefore, $$dL_o/dT = nL[CTE + (1/n)(dn/dT)]. \tag{5}$$

Finally, we define a FOM as the fractional change in optical path length with respect to temperature as follows:

$$FOM = (1/L_o)(dL_o/dT) \tag{6}$$

and substituting equations (1) and (5) into equation (6) we get:

$$FOM = CTE + (1/n)(dn/dT) \tag{7}$$

which has units of ppm/K (i.e., parts-per-million per degree Kelvin). For the crystalline material of the etalon to be temperature insensitive FOM=0, which reduces equation (7) to $$CTE = -(1/n)(dn/dT) \tag{8}$$

Thus, in the ideal case the CTE and (1/n)(dn/dT) of the crystalline material should be of the same magnitude and of opposite sign. Depending on system considerations, however, less than perfect equality may be acceptable. In addition, the material should have high transparency over a predetermined wavelength range of operation $\Delta\lambda$ of the etalon, and dn/dT should be relatively insensitive to temperature and wavelength; i.e., d/dT (dn/dT) and d/d$\lambda$(dn/dT) should be essentially constant over the operating range of interest.

Consider for example systems that operate at wavelengths in the range of 1–2 $\mu$m, which embraces those that operate at wavelengths of 1300 nm and 1550 nm generated by InP/InGaAsP semiconductor lasers. In such cases it would be desirable for the crystalline material of the etalon to have transparency in excess of about 90%. For practical implementation of such an etalon the FOM should be much less than that of fused silica (also known as a-SiO$_2$), the typical prior art etalon material. We have measured fused silica to have an FOM of about 6.25 ppm/K. Thus, crystalline materials with an FOM less than about ±2 ppm/K would be preferred.

For most applications of this type the material should ideally have isotropic properties (e.g., an amorphous structure or a crystalline structure with cubic symmetry). However, if this ideal cannot be satisfied, then the next best option is for the material to crystallize in a uniaxial crystal system (e.g., tetragonal, and hexagonal) in order to reduce the effects of birefringence on the radiation incident on the etalon from the source 12. In general, uniaxial crystals with a relatively low FOM for the ordinary ray are oriented such that the principal axis is aligned with the propagation direction, in which case, polarization is not an issue. However, biaxial crystals and uniaxial crystals with a relative low FOM for the extraordinary ray are oriented such that the direction with preferred FOM is aligned with the propagation direction and a secondary axis is aligned with the polarization direction in order to reduce birefringence if the polarization of the source is known a priori (e.g., as with semiconductor lasers, which might be designed to be TE polarized). Suitable crystalline materials include LiCaAlF$_6$ and CaWO$_4$, which are discussed in the Section entitled Crystalline Materials, infra. If, however, the polarization of the source is not known a priori (e.g., as with standard optical fibers), then the crystal should preferably have no polarization dependence. For some applications, however, where the source generates polarized radiation, this constraint may be relaxed.

Alternative Embodiments

We next consider the case of an optical path that includes two or more different materials chosen so that the path has a predetermined thermo-optic behavior, which includes the specific case of a temperature insensitive path. For example, assume the path includes three dissimilar materials M1, M2 and M3 with effective refractive indices and lengths n$_i$ and L$_i$ (i=1,2,3), respectively. A specific requirement that is illustratively imposed on such an arrangement is that the temperature-induced change in the optical path length through the three materials be equal to the temperature-induced change in a cavity of length L$_1$ and material M1. Using analysis of the type described above to calculate an FOM, it can be shown that the properties of material M3 are specified by the following equation:

$$FOM_3 = -(n_2L_2/n_3L_3)FOM_2 \quad (9)$$

where FOM$_2$ is given by $$FOM_2 = (n_2L_2)^{-1}d/dT(n_2L_2). \quad (10)$$

Figure 3:
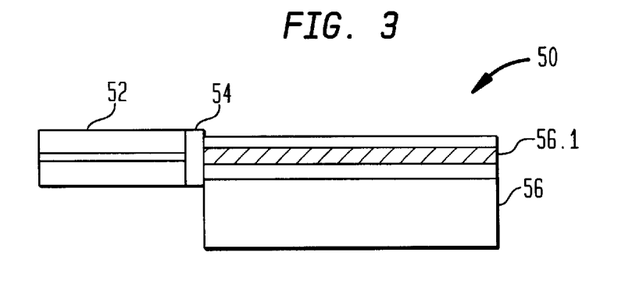
FIG. 3 is a schematic view of an optical subassembly that includes a semiconductor laser coupled to a grating in accordance with another embodiment of our invention.

An illustration of such an arrangement is shown in FIG. 3, which depicts an optical subsystem 50 including a semiconductor laser 52 (corresponding to material M1) coupled to a glass grating 56 (corresponding to material M2) via a compensating crystalline layer 54 (corresponding to material M3) disposed therebetween. A similar subsystem, not shown, includes a compensating layer disposed between a silica waveguide (e.g. an integrated waveguide of the type used in silicon optical bench technology) and a garnet body (e.g., a Faraday rotator used in an optical isolator).

Figure 4:
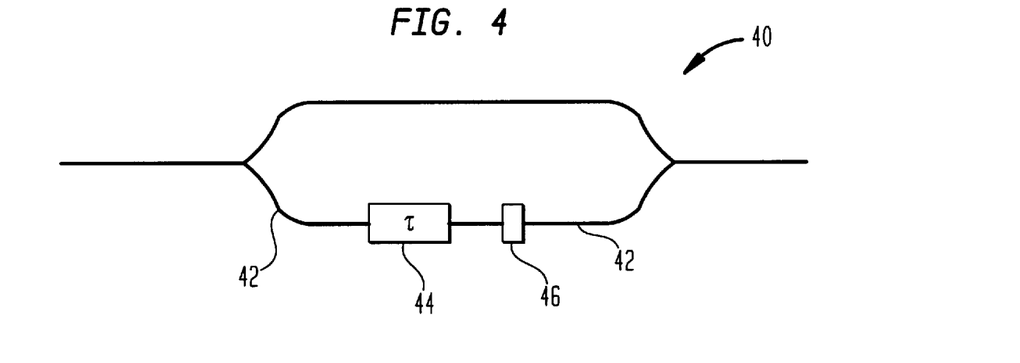
FIG. 4 is a schematic view of a Mach-Zehnder interferometer in accordance with still another embodiment of our invention.

Another illustration of such an arrangement is shown in FIG. 4, which depicts a Mach-Zehnder interferometer 40 including in one arm or branch a waveguide 42 (corresponding to material M1), a delay element 44 (corresponding to material M2), and a compensating layer 46 (corresponding to layer M3) disposed therebetween).

Figure 5:
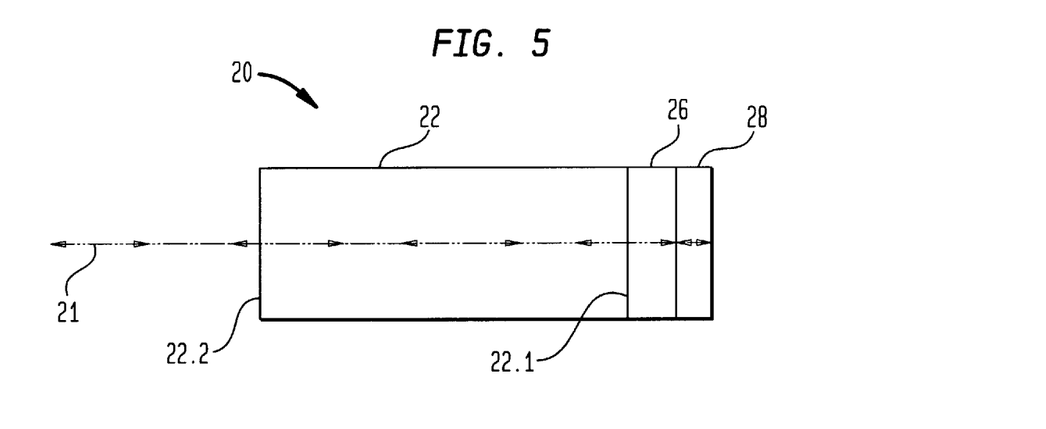
FIG. 5 is a schematic view of an optical subassembly that includes a folded optical path in accordance with another embodiment of our invention.

In contrast with the foregoing embodiments where all of the components are arranged in tandem, an alternative embodiment of our invention includes a folded optical path, as shown illustratively in FIG. 5. Here, a portion of an optical path includes an optical waveguide 22, a thermo-optic compensating layer 26 of suitable crystalline material disposed at one end 22.1 of the waveguide 22, and a reflector 28 disposed on the compensating layer 26. An incoming radiation beam 21 from a source not shown is coupled into the other end 22.2 of the waveguide 22, propagates along the waveguide and through the compensating layer 26, and is reflected by the reflector 28 back into the layer 26 and then into the waveguide 22. The beam emerges from end 22.2. The bi-directional nature of the propagation is depicted by the double-headed arrows of beam 21. Using analysis similar to that described above, a FOM for the folded path can be calculated and the material of layer 26 chosen so that the path has a desired thermo-optic behavior.

Figure 6:
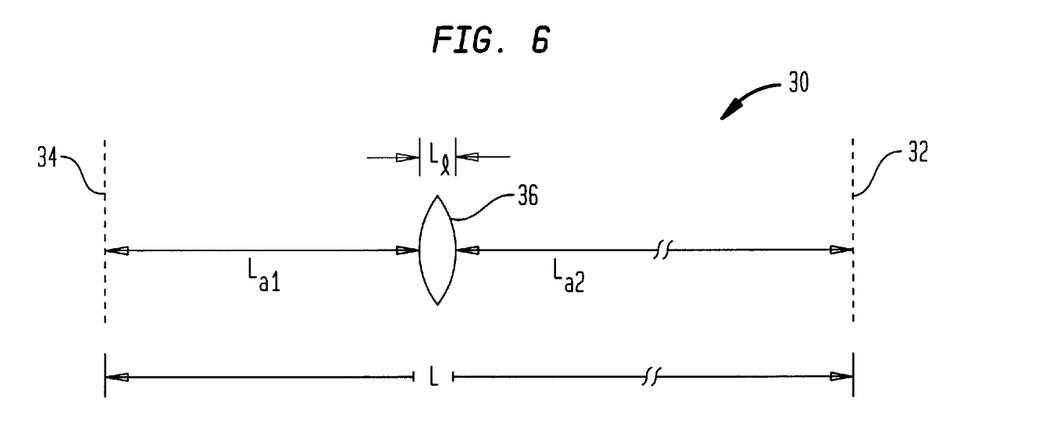
FIG. 6 is a schematic view of a telescope in accordance with yet another embodiment of our invention.

The optical path in a system or subsystem may include portions that constitute a free space path and in which a compensating material is disposed to cause the overall optical path to be temperature insensitive or to have some other desired thermo-optic behavior. As a specific case of a temperature insensitive optical path extending from one point fixed in space, through an optical element, to another point fixed in space, consider a telescope of the type illustrated in FIG. 6. Here, a lens 36 is disposed between an object plane 32 and an image plane 34 that have a fixed separation. However, the lens 36 comprises a crystalline material in accordance with our invention. More specifically, assuming that the temperature-induced change of the total optical path is arranged by means well known in the art to be zero, or nearly so, then $$L_{a1} + L_{a2} + L_1 = L = constant \quad (11)$$

and further assuming that n$_a$=1 and dn$_a$/dT=0, then a FOM can be defined for the crystalline material of the lens as follows:

$$(n_1 - 1)CTE_1 = -dn_1/dT \quad (12)$$

where n$_1$ and CTE$_1$ are the refractive index and CTE of the crystalline material of the lens 36.

Crystalline Materials

The following table illustrates the kind of crystalline materials that find utility in various embodiments of our invention depending on the specific application; e.g., depending on the wavelength of operation, the polarization conditions imposed by the components, and the degree of compensation desired. For example, all of the materials listed in the table, except for PbS and ZnGeP$_2$, may be suitable for use in telecommunication systems operating at wavelengths in the range of about 1.2–1.7 µm, but those with FOMs in the approximate range of ±2 ppm/K are preferred for etalon applications; that is, AgCl, LiCaAlF$_6$, LiIO$_3$, CaCO$_3$, and CaWO$_4$ are preferred. Other considerations, such as processing, stability and water solubility, may dictate that one of these materials with a slightly higher FOM will be preferred over another with a somewhat lower FOM. For example, LiCaAlF$_6$ does not have the lowest FOM (in absolute value), yet it is currently preferred because it is stable, immune to water vapor, insensitive to light and relatively easy to process. LiCaAlF$_6$ has an FOM of −2.3 (calculated) and −1.55 (measured). All of the other materials in this group have smaller FOMs (in absolute value).

The FOMs listed below have been calculated from data available in the literature. The data were taken for room temperature operation at visible wavelengths. However, we expect that the FOMs will not differ significantly at other temperatures within typical operating ranges (e.g., −40° C. to +85° C.) and that they are likely to improve at near infrared wavelengths. This predication is based, in part, on the recognition that for materials with band gap energies greater than about 1.5 eV dn/dT tends to be more sensitive to temperature and to wavelength as the latter approaches the ultraviolet and, conversely, less sensitive in the near infrared.

For comparison purposes, a prior art etalon material (a-SiO$_2$ or fused silica) is included in the table.

From this table we make the following observations:

(1) Halide solid solutions: The FOM varies from positive to negative between KBr and CsBr and between KCl and CsCl. Thus, we expect that with solid solutions of either K$_{1−x}$Cs$_x$Cl or K$_{1−x}$Cs$_x$Br (0≦x≦1) the FOM should be tunable to zero, as desired for etalon applications, or to any other FOM value between about −5 and +14, as might be required by other applications. Similar comments apply to combinations with the other halides listed; i.e., with AgCl, NaBr and NaCl.

(2) Molybdate solid solutions: As with the halides above, the FOM varies from positive to negative between CaMoO$_4$ and PbMoO$_4$, thereby allowing solid solutions of Ca$_x$Pb$_{1−x}$MoO$_4$ (0≦x≦1) to be tailored to an FOM of zero as desired for etalon applications, or to any other FOM value between −15 and +17, as might be required by other applications. However, these materials crystallize in monoclinic structures (not uniaxial) and, therefore, should be utilized only for applications in which control of polarization is not important.

(3) RCO$_3$: In this carbonate material R is an element selected from the group consisting of Ca and Sr, or both. Calcium carbonate, CaCO$_3$, exhibits a small FOM of 1.3 in the extraordinary direction where a small negative CTE of −5.8 nearly balances a small positive dn/dT of +10.5. Sr may be substituted for some of the Ca in order to tailor the CTE and dn/dT of the carbonate to desired values.

Figure 7:
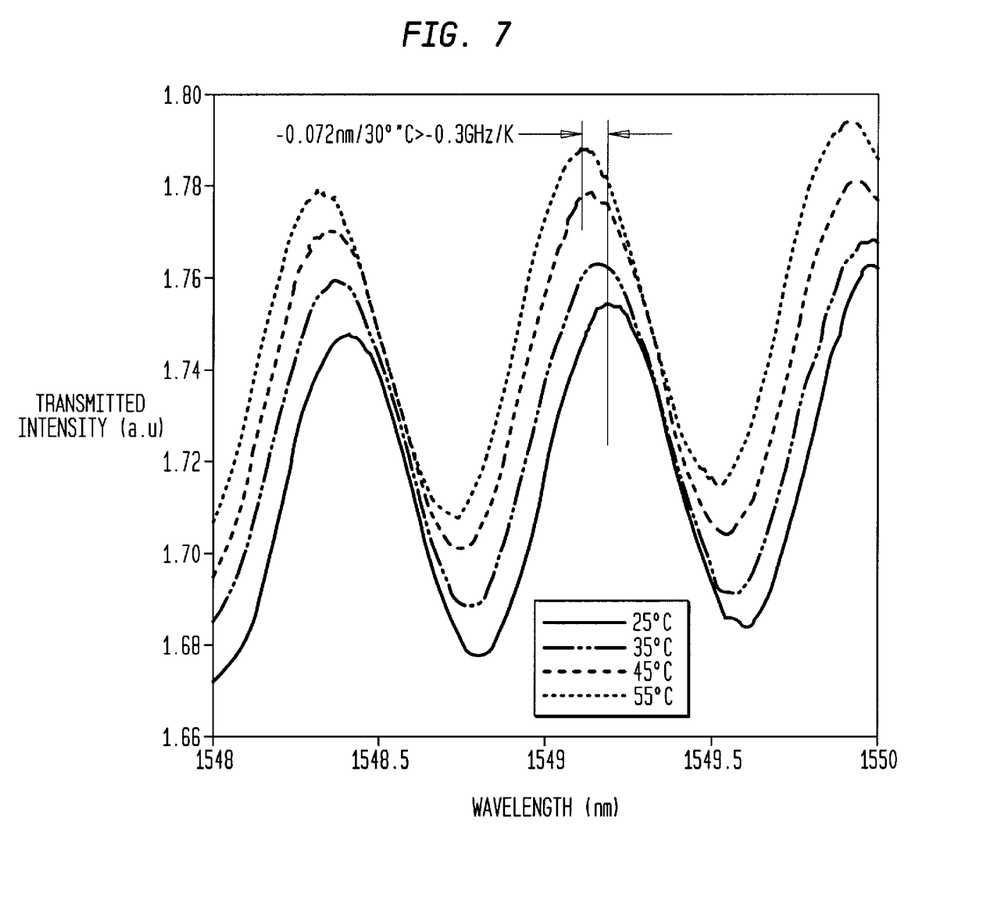
FIG. 7 is a graph of the transmission characteristics of a $LiCaAlF_6$ etalon as a function of temperature.
Figure 8:
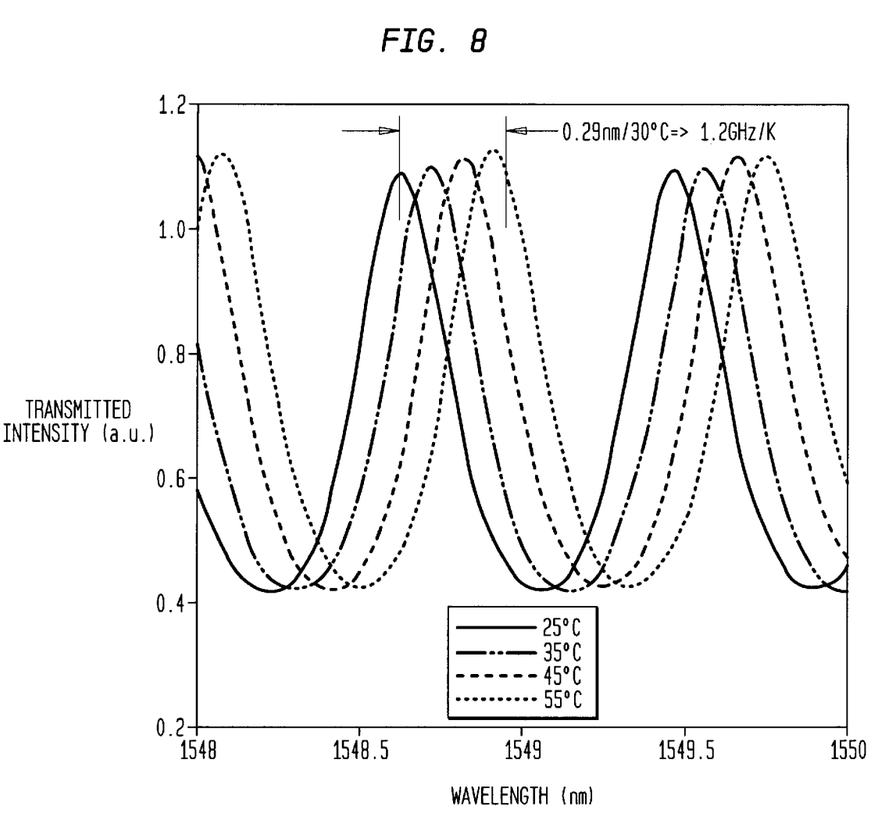
FIG. 8 is a graph of the transmission characteristics of a prior art, fused silica etalon as a function of temperature.

(4) LiRQF$_6$: In these materials, which are pure compounds, the parameter R consists of an element selected from the group consisting of Ca, Sr or both, and Q is an element selected from the group consisting of Al and Ga, or both. Preferably the material comprises LiCaAlF$_6$, which is an insulating fluoride that crystallizes in a hexagonal structure. In LiCaAlF$_6$ a small positive CTE of 1.0 is nearly balanced by a small negative dn/dT of −4.6, resulting in a FOM (−2.3 calculated, −1.55 measured) that is significantly smaller than that of amorphous (fused) SiO$_2$ (7.3 calculated, 6.25 measured) in the ordinary direction (along the crystallographic unique axis as found in tetragonal and hexagonal systems). Thus LiCaAlF$_6$ is a preferred material for use in etalons at telecommunication system wavelengths of about 1.2–1.7 µm. The efficacy of LiCaAlF$_6$ for temperature insensitive etalon applications is suggested by FIG. 7, which shows the transmitted intensity of radiation through the etalon at various wavelengths in the range of 1548–1550 nm and at various temperatures in the range of 25–55° C. The family of curves demonstrates that as temperature increases the transmission curves shift to lower wavelengths by an amount −0.072 nm/30° C. (−0.3 GHz/K). In contrast, a fused silica etalon exhibits a much larger shift (0.29 nm/30 C=1.2 GHz/K), and the shift is to higher wavelengths as shown in FIG. 8. In contrast, substituting Sr for Ca in this material yields LiSrAlF$_6$ which has somewhat more negative FOM of −11.9.

(5) LiRR'QQ'F$_6$: By forming solid solutions based on altering the composition of the LiCaAlF$_6$ material slightly (e.g., by substituting small amounts of R'=Sr for R=Ca and/or Q'=Ga for Q=Al), we expect to be able to reduce the shift to essentially zero, the desired property for a temperature insensitive etalon. Thus, the addition of Sr and/or Ga to the material would allow its FOM to be optimized to etalon applications and/or tailored to other applications.

(6) LiIO$_3$: In this material a relatively large, negative dn/dT (−94) nearly balances a relatively large, positive CTE (50) to yield a FOM of −0.8.

(7) Crystalline SiO$_2$: This material, also known as quartz SiO$_2$, but not the fused, amorphous version, was calculated to have an FOM of 3.5, whereas the measured value was 8.8.

(8) Lead sulfide: PbS has a large negative FOM of −493 because of its large negative dn/dT of −2100. Consequently, this material is expected to have utility in temperature sensing applications.

(9) ZnGeP$_2$: This material has large positive FOM (63.6) because of its large positive dn/dT (151) and it positive CTE (15.9). Consequently, it too is expected to have utility in temperature sensing applications.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the term refractive index is intended to embrace both the simple index n of an essentially homogeneous, single layer body as well as the more complex effective index n$_{eff}$ of a multilayered and/or inhomogeneous body (e.g., a multi-layered waveguide).

What is claimed is:

1. A method of controlling the thermo-optic behavior of an optical path over a temperature range comprising the steps of:

determining a figure of merit (FOM) for the path, and including a body of crystalline material in the path, the material being highly transparent at a wavelength of radiation propagating in the path and having a coefficient of thermal expansion (CTE) and a refractive index change with temperature (dn/dT) that are mutually adapted to satisfy said FOM over said range.

2. The invention of claim 1 wherein said including step provides a crystalline material in which said CTE and dn/dT have the same signs.

3. The invention of claim 1 wherein said including step provides a crystalline material in which said CTE and dn/dT have opposite signs.

4. The invention of claim 3 wherein said including step provides a crystalline material that comprises $LiRQF_6$, where R is selected from the group consisting of Ca and Sr or both, and Q is selected from the group consisting of Ga and Al or both.

5. The invention of claim 4 wherein said including step provides a crystalline material that comprises $LiCaAlF_6$.

6. The invention of claim 3 wherein said including step provides a crystalline material that comprises $RCO_3$, where R is selected from the group consisting of Ca and Sr or both.

7. The invention of claim 6 wherein said including step provides a crystalline material that comprises $CaCO_3$.

8. The invention of claim 3 wherein said including step provides a crystalline material that comprises $RWO_4$ where R is selected from the group consisting of Ca and Sr or both.

9. The invention of claim 8 wherein said including step provides a crystalline material that comprises $CaWO_4$.

10. The invention of claim 3 wherein said including step provides a crystalline material that comprises a halide of K, Cs or both.

11. The invention of claim 3 wherein said including step provides a crystalline material that comprises a molybdate.

12. The invention of claim 11 wherein said molybdate is selected from the group consisting of $PbMoO_4$ and $CaMoO_4$.

13. The invention of claim 1 wherein said optical path is defined by a temperature insensitive etalon, and said FOM is determined to be $CTE=-(1/n)(dn/dT)$, where n is the refractive index of the crystalline material of said etalon.

14. The invention of claim 13 wherein dn/dT is relatively insensitive to temperature and wavelength over the operating range of interest.

15. The invention of claim 13 wherein said material is selected from the group consisting of AgCl, $LiCaAlF_6$, $LiIO_3$, $CaCO_3$, and $CaWO_4$.

16. The invention of claim 1 wherein said optical path is defined by the object and image planes of a telescope that have a fixed separation and a lens located therebetween, and said FOM is determined to be $(n-1)CTE=-dn/dT$, where n is the refractive index of the crystalline material of said lens and CTE is the coefficient of thermal expansion of the crystalline material of said lens.

17. The invention of claim 1 wherein said optical path is a folded path at at least one location thereof and said including step comprises positioning said body at said location.

18. The invention of claim 1 wherein said optical path includes first, second and third portions having lengths $L_1$, $L_2$ and $L_3$ and refractive indices $n_1$, $n_2$ and $n_3$, respectively.

19. The invention of claim 18 wherein said third portion is disposed between said first and second portions and comprises said body, and said FOM is determined to be $FOM_3=-(n_2L_2/n_3L_3)FOM_2$.

20. The invention of claim 19 wherein said first portion comprises a glass waveguide and said second portion comprises a crystalline device.

21. The invention of claim 18 wherein said optical path comprises an arm of a Mach-Zehnder interferometer, said first portion comprising a delay element in said arm, said second portion comprising an optical waveguide in said arm, and said third portion comprising said body.

22. An article of manufacture comprising
an optical path characterized by a figure of merit (FOM), and
a body of crystalline material disposed in said path, said material being highly transparent at a wavelength of radiation propagating in the path and having a coefficient of thermal expansion (CTE) and a refractive index change with temperature (dn/dT) that are mutually adapted to satisfy said FOM over a range of temperatures.

23. The invention of claim 22 wherein said body comprises a crystalline material in which said CTE and dn/dT have the same signs.

24. The invention of claim 22 wherein said body comprises a crystalline material in which said CTE and dn/dT have opposite signs.

25. The invention of claim 24 wherein said crystalline material comprises $LiRQF_6$, where R is selected from the group consisting of Ca and Sr or both and Q is selected from the group consisting of Ga and Al or both.

26. The invention of claim 25 wherein said crystalline material comprises $LiCaAlF_6$.

27. The invention of claim 24 wherein said crystalline material comprises $RCO_3$, where R is selected from the group consisting of Ca and Sr or both.

28. The invention of claim 27 wherein said crystalline material comprises $CaCO_3$.

29. The invention of claim 24 wherein said crystalline material that comprises $RWO_4$, where R is selected from the group consisting of Ca and Sr or both.

30. The invention of claim 29 wherein said crystalline material comprises $CaWO_4$.

31. The invention of claim 24 wherein said crystalline material comprises a halide of K, Cs or both.

32. The invention of claim 24 wherein said crystalline material comprises a molybdate.

33. The invention of claim 32 wherein said molybdate is selected from the group consisting of $PbMoO_4$ and $CaMoO_4$.

34. The invention of claim 22 wherein said optical path is defined by a temperature insensitive etalon, and said FOM is defined by the equation $CTE=-(1/n)(dn/dT)$, where n is the refractive index of the crystalline material of said etalon.

35. The invention of claim 34 wherein dn/dT is relatively insensitive to temperature and wavelength over the operating range of interest.

36. The invention of claim 34 wherein said material is selected from the group consisting of AgCl, $LiCaAlF_6$, $LiIO_3$, $CaCO_3$, and $CaWO_4$.

37. The invention of claim 22 wherein said optical path is defined by the object and image planes of a telescope that have a fixed separation and a lens located therebetween, and said FOM is defined by the equation $(n-1)CTE=-dn/dT$, where n is the refractive index of the crystalline material of said lens and CTE is the coefficient of thermal expansion of the crystalline material of said lens.

38. The invention of claim 22 wherein said optical path is a folded path at at least one location thereof, said body being disposed at said location.

39. The invention of claim 22 wherein said optical path includes first, second and third portions having lengths $L_1$, $L_2$ and $L_3$ and refractive indices $n_1$, $n_2$ and $n_3$, respectively.

40. The invention of claim 39 wherein said third portion is disposed between said first and second portions and comprises said body, and said FOM is defined by the equation $FOM_3=(n_2L_2/n_3L_3)FOM_2$.

41. The invention of claim 40 wherein said first portion comprises a glass waveguide and said second portion comprises a crystalline device.

42. The invention of claim 39 wherein said optical path comprises an arm of a Mach-Zehnder interferometer, said first portion comprising a delay element in said arm, said second portion comprising an optical waveguide in said arm, and said third portion comprising said body.

43. The invention of claim 22 wherein said optical path is included in a temperature sensor and said crystalline material comprises PbS.

44. A WDM optical transmitter for operation over a range of temperatures comprising:

a source for generating an output signal at any one of a multiplicity of different wavelengths, a temperature controller for tuning the wavelength of said source to a predetermined one of said wavelengths, and a feedback loop including a frequency discriminator for stabilizing the wavelength of said source at said predetermined wavelength, said discriminator including an etalon, characterized in that said etalon has a FOM, and said etalon comprises a body of crystalline material that is highly transparent to radiation at said predetermined wavelength and that has a CTE and a dn/dT that are mutually adapted to satisfy said FOM over said temperature range.

45. The invention of claim 44 wherein said FOM=CTE+ (1/n) (dn/dT).

46. The invention of claim 45 wherein dn/dT is relatively insensitive to temperature and wavelength over the operating range of interest.

47. The invention of claim 46 wherein said etalon is essentially temperature insensitive and said FOM is essentially zero.

48. The invention of claim 47 wherein said crystalline material comprises $LiRQF_6$, where R is selected from the group consisting of Ca and Sr or both and Q is selected from the group consisting of Ga and Al or both.

49. The invention of claim 48 wherein said material comprises $LiCaAlF_6$.

* * * * *